(12) United States Patent
Park

(10) Patent No.: US 8,759,846 B2
(45) Date of Patent: Jun. 24, 2014

(54) LIGHT EMITTING DEVICE

(75) Inventor: Jun Seok Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 45 days.

(21) Appl. No.: 12/671,179

(22) PCT Filed: Aug. 11, 2008

(86) PCT No.: PCT/KR2008/004668
§ 371 (c)(1),
(2), (4) Date: Jan. 28, 2010

(87) PCT Pub. No.: WO2009/028812
PCT Pub. Date: Mar. 5, 2009

(65) Prior Publication Data
US 2010/0193807 A1    Aug. 5, 2010

(30) Foreign Application Priority Data
Aug. 28, 2007    (KR) .................. 10-2007-0086578

(51) Int. Cl.
*H01L 29/18* (2006.01)
*H01L 33/64* (2010.01)
*H05K 1/02* (2006.01)

(52) U.S. Cl.
CPC .... *H01L 33/641* (2013.01); *H05K 2201/10106* (2013.01); *H05K 2201/0209* (2013.01); *H05K 2201/09781* (2013.01); *H05K 1/0209* (2013.01); *H05K 1/0206* (2013.01); *H01L 33/642* (2013.01); *H05K 2201/09663* (2013.01); *H05K 2201/09318* (2013.01)
USPC .......... 257/88; 257/99; 257/E33.066

(58) Field of Classification Search
USPC .............. 257/88, 99, E33.066, E33.075
See application file for complete search history.

(56) References Cited

U.S. PATENT DOCUMENTS

| 5,113,315 | A | 5/1992 | Capp et al. |
|---|---|---|---|
| 6,838,702 | B1 | 1/2005 | Ho |
| 6,936,855 | B1 * | 8/2005 | Harrah ............................ 257/88 |
| 7,365,407 | B2 * | 4/2008 | Ng et al. ........................ 257/433 |
| 7,550,319 | B2 * | 6/2009 | Wang et al. .................... 438/125 |
| 7,808,013 | B2 * | 10/2010 | Mendendorp et al. .......... 257/99 |
| 7,960,819 | B2 * | 6/2011 | Loh et al. ...................... 257/676 |
| 2007/0035930 | A1 | 2/2007 | Sung et al. |
| 2007/0115686 | A1 * | 5/2007 | Tyberghien ................... 362/580 |
| 2007/0170452 | A1 | 7/2007 | Kurokawa et al. |
| 2009/0015736 | A1 * | 1/2009 | Weller et al. .................... 349/11 |

FOREIGN PATENT DOCUMENTS

| CN | 2835786 Y | 11/2006 |
|---|---|---|
| JP | 2000-183406 A | 6/2000 |
| JP | 2002-198660 A | 7/2002 |
| JP | 2006-128512 A | 5/2006 |
| JP | 2007-129191 A | 5/2007 |
| KR | 10-0631111 B1 | 9/2006 |
| KR | 10-2008-0060737 A | 7/2008 |

* cited by examiner

*Primary Examiner* — Tony Tran
(74) *Attorney, Agent, or Firm* — Birch, Stewart, Kolasch & Birch, LLP

(57) ABSTRACT

A light emitting device is provided. The light emitting device comprises a substrate, a first lead frame and a second lead frame on the substrate, a first light emitting diode, a heat conductor on the substrate, and a heat transfer pad. The first light emitting diode on the first lead frame is electrically connected to the first lead frame and the second lead frame. The heat conductor is electrically separated from the first lead frame. The heat transfer pad contacts the first lead frame and the heat conductor thermally to connect the first lead frame to the heat conductor.

7 Claims, 2 Drawing Sheets

LIGHT EMITTING DEVICE

TECHNICAL FIELD

The present disclosure relates to a light emitting device.

BACKGROUND ART

A light emitting diode (LED) is a semiconductor device that can reproduce various colors by forming a light emitting source using compound semiconductor materials such as GaAs, AlGaAs, GaN, InGaN, or AlGaInP.

A light emitting device using the LED is used as a lighting device or a light source for various electronic devices.

DISCLOSURE OF INVENTION

Technical Problem

Embodiments provide a light emitting device.

Embodiments also provide a light emitting device with improved heat dissipation efficiency.

Technical Solution

In an embodiment, a light emitting device comprises: a substrate; a first lead frame and a second lead frame on the substrate; a first light emitting diode on the first lead frame electrically connected to the first lead frame and the second lead frame; a heat conductor on the substrate, the heat conductor being electrically separated from the first lead frame; and a heat transfer pad contacting the first lead frame and the heat conductor to thermally connect the first lead frame to the heat conductor.

In an embodiment, a light emitting device comprises: a substrate; a first lead frame and a second lead frame on the substrate; a heat conductor on the substrate, the heat conductor being electrically separated from the first lead frame and the second lead frame; and a light emitting diode on the heat conductor being electrically connected to the first lead frame and the second lead frame.

In an embodiment, a light emitting device comprises: a substrate; a first lead frame, a second lead frame, a third lead frame, and a fourth lead frame on the substrate; a first heat conductor and a second heat conductor on the substrate; a first light emitting diode on the first heat conductor being electrically connected to the first lead frame and the second lead frame; a second light emitting diode on the third lead frame being electrically connected to the third lead frame and the fourth lead frame; and a heat transfer pad contacting the third lead frame and the second heat conductor to thermally connect the third lead frame to the second heat conductor.

Advantageous Effects

Embodiments can provide a lighting emitting device.

Embodiments can also provide a light emitting device with improved heat dissipation efficiency.

MODE FOR THE INVENTION

Figure 1:
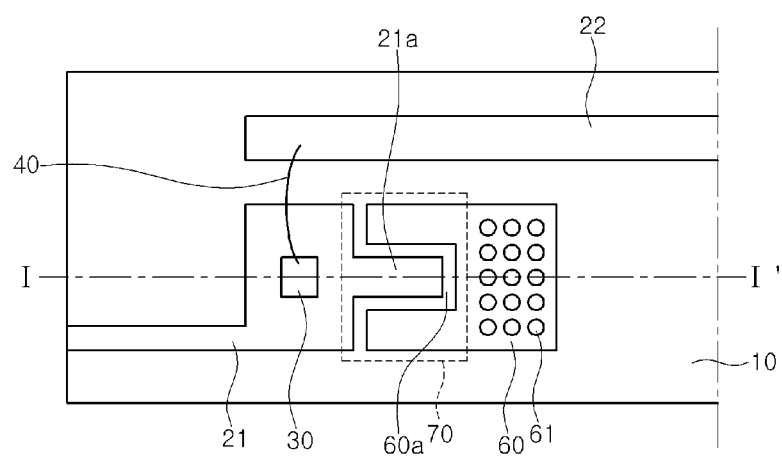
FIG. 1 is a top view of a light emitting device according to a first embodiment.

In the following description according to the present disclosure, it will be understood that when a layer (or film), a region, a pattern, or a structure is referred to as being "on/under" another substrate, layer (film), region, pad, or pattern, it can be directly on the other layer or substrate, or intervening layers may also be present.

Also, thicknesses or dimensions of layers may be exaggerated, omitted, or schematically illustrated in the accompanying drawings for convenience and clarity. The dimension of each component in the drawings does not reflect an actual dimension thereof.

Hereinafter, a light emitting device according to an embodiment will be described in detail with reference to accompanying drawings.

Figure 2:
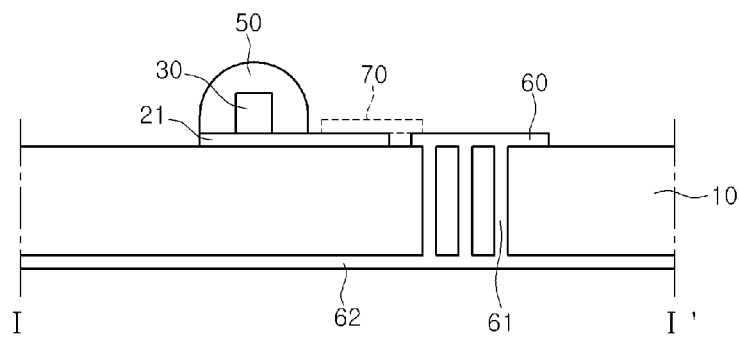
FIG. 2 is a cross-sectional view taken along line I-I' in FIG. 1.

FIG. 1 is a top view of a light emitting device according to an embodiment, and FIG. 2 is a cross-sectional view taken along line I-I' in FIG. 1.

Referring to FIGS. 1 and 2, a light emitting device according to an embodiment includes a first lead frame 21 and a second lead frame 22 spaced apart from the first lead frame 21 on a substrate 10. A light emitting diode (LED) 30 is mounted on the first lead frame 21.

A first electrode (not shown) of the LED 30 is in contact with and electrically connected to the first lead frame 21. A second electrode (not shown) of the LED 30 is electrically connected to the second lead frame 22 through a wire 40 that is a conductive member.

Although not shown, the first electrode of the LED 30 may be electrically connected to the first lead frame 21 through a wire.

That is, in the embodiment of FIGS. 1 and 2, the first electrode is formed on a bottom surface of the LED 30 and the second electrode is formed on a top surface of the LED 30, however, the first and second electrodes may be formed on the top surface of the LED 30 and an insulating layer may be formed on the bottom surface of the LED 30. In this case, the first electrode may be electrically connected to the first lead frame 21 through a wire.

The LED 30 may receive a power voltage from the first lead frame 21 and the second lead frame 22 to emit one of red, green, blue, and white lights.

A heat conductor 60 is formed such that it is spaced apart from the first lead frame 21 on the substrate 10. For example, the heat conductor 60 may be a heat dissipation pad. The heat conductor 60 is electrically separated from the first lead frame 21. The heat conductor 60 may be formed of a metal with high heat conductivity, such as silver (Ag), aluminum (Al), or copper (Cu).

The heat conductor 60 is disposed adjacent to the first lead frame 21 so that heat can be effectively transferred from the first lead frame 21. The heat conductor 60 is connected to a metal layer 62 under the substrate 10 through a via hole 61 filled with metal with high heat conductivity.

The first lead frame 21 includes a protruding portion 21a that protrudes toward the heat conductor 60 and the heat conductor 60 includes a recessed portion 60a that surrounds the protruding portion 21a, such that heat can be effectively transferred between the first lead frame 21 and the heat conductor 60.

Alternatively, the heat conductor 60 may include a protruding portion (not shown) that protrudes toward the first lead frame 21 and the first lead frame 21 may include a recessed portion (not shown) that surrounds the protruding portion.

A heat transfer pad 70 is formed between the first lead frame 21 and the heat conductor 60. The heat transfer pad 70 is formed of a material with high heat conductivity such that heat can be effectively transferred between the first lead frame 21 and the heat conductor 60.

The heat transfer pad 70 may be formed as a tape to be attached onto the substrate 10 including the first lead frame 21 and the heat conductor 60. Alternatively, the heat transfer pad 70 may be formed as paint or resin to be applied on the substrate 10 including the first lead frame 21 and the heat conductor 60.

When the heat transfer pad 70 is formed as paint, it may be applied on an entire surface of the substrate 10.

The heat transfer pad 70 may be formed of a resin with high heat conductivity and high electrical resistance.

The heat transfer pad 70 is formed of a material with very high electrical resistance, that is, a material with very low electrical conductivity to prevent electrical connection of the first lead frame 21 and the heat conductor 60.

Also, at least a part of a portion of the first lead frame 21 that contacts the heat transfer pad 70 may be formed of a material with heat conductivity higher than that of a portion of the first lead frame 21 that dost not contact the heat transfer pad 70.

For example, the first lead frame 21 may be formed of copper (Cu), and at least a part of a portion of the first lead frame 21 that contacts the heat transfer pad 70 may be formed of silver (Ag) with heat conductivity higher than the copper (Cu).

Similarly, at least a part of a portion of the heat conductor 60 that contacts the heat transfer pad 70 may be formed of a material with heat conductivity higher than that of a portion of the first lead frame 21 that does not contact the heat transfer pad 70.

For example, the heat conductor 60 may be formed of copper (Cu), and at least a part of a portion of the heat conductor 60 that contacts the heat transfer pad 70 may be formed of silver (Ag) with heat conductivity higher than the copper (Cu).

Therefore, heat can be transferred more effectively through the heat transfer pad 70.

although not shown in FIG. 1, as shown in FIG. 2, a molding member 50 may be formed on the substrate 10 to protect the LED 30 and the wire 40.

The molding member 50 may contain phosphor, and a surface of the molding member 50 may be formed in a convex shape, a concave shape, a flat shape, or the like.

Figure 3:
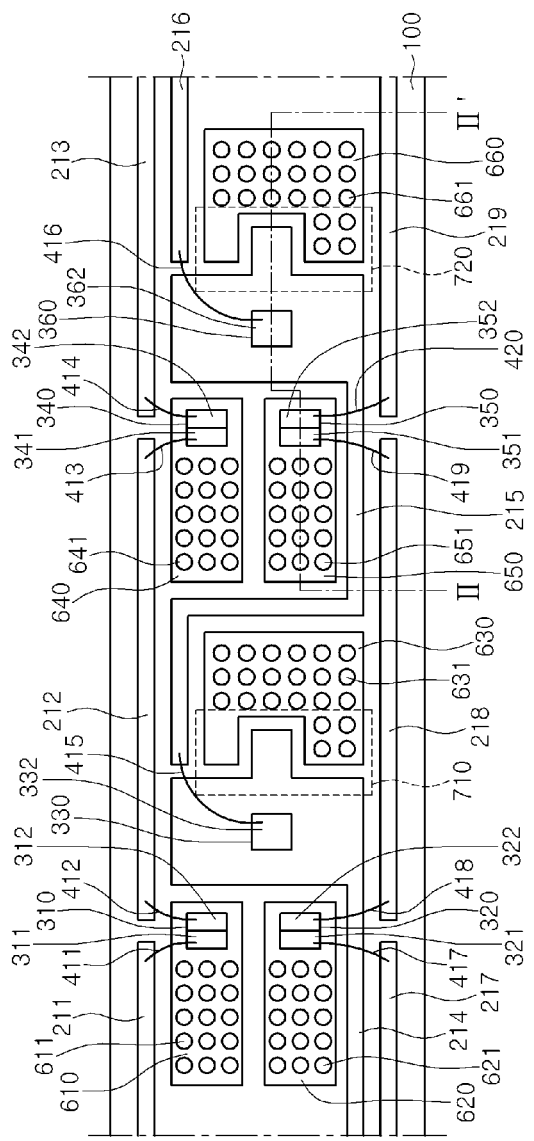
FIGS. 3 and 4 are views of a light emitting device according to a second embodiment.
Figure 4:
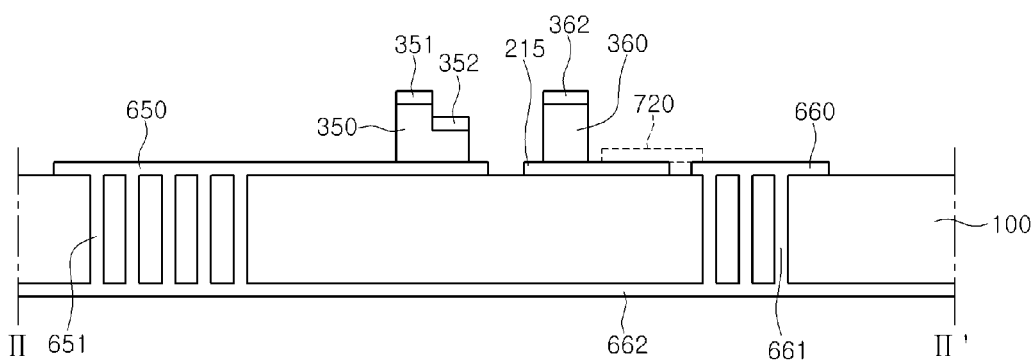

The molding member 50 may be formed in an embodiment of FIGS. 3 and 4 as well as the embodiment of FIGS. 1 and 2, however, it is not specifically illustrated.

In the light emitting device according to the embodiment, a power voltage is supplied to the LED 30, and heat generated in the LED 30 is dissipated quickly through the first lead frame 21 on which the LED 30 is mounted.

The heat generated in the LED 30 is transferred to the first lead frame 21, and the heat is transferred from the first lead frame 21 to the heat conductor 60 through the heat transfer pad 70.

The heat transferred to the heat conductor 60 is transferred to the metal layer 62 under the substrate 10 through the via hole 61 and is rapidly dissipated to the outside. The via hole 61 may be formed in plural so as to dissipate heat more effectively.

In the light emitting device according to the embodiment, the heat conductor 60 is electrically separated from the first lead frame 21 to prevent electrical short circuit between the first lead frame 21 and other LEDs or electric components through the via hole 61 and the metal layer 62 that are connected to the heat conductor 60.

In the light emitting device according to the embodiment, heat can be transferred effectively between the first lead frame 21 for supplying a power voltage to the LED 30 and the heat conductor 60, thereby dissipating heat quickly.

Although the heat transfer pad 70 is formed only between the first lead frame 21 and the heat conductor 60 in the embodiment of FIGS. 1 and 2, the heat transfer pad 70 may be also formed between the second lead frame 22 and the heat conductor 60.

Since the heat transfer pad 70 is formed of a material with very high resistance, power is not electrically connected to the heat conductor 60 though at least one of the first and second lead frames 21 and 22 is thermally connected to the heat conductor 60 using the heat transfer pad 70.

FIGS. 3 and 4 are views of a light emitting device according to another embodiment. FIG. 4 is a cross-sectional view taken along line II-II' in FIG. 3.

In the embodiment of FIGS. 3 and 4, descriptions of the same parts as those of the embodiment of FIGS. 1 and 2 will be omitted. Therefore, spirits described in FIGS. 1 and 2 can be employed to the embodiment of FIGS. 3 and 4.

Referring to FIGS. 3 and 4, a light emitting device includes a first lead frame 211, a second lead frame 212, and a third lead frame 213, which are formed on a substrate 100, and a first LED 310 and a fourth LED 340, which are electrically connected to at least one of the first lead frame 211, the second lead frame 212, and the third lead frame 213.

For example, the first LED 310 and the fourth LED 340 may be an LED that emits green light, and are connected in series through the first lead frame 211, the second lead frame 212, and the third lead frame 213.

A first electrode 311 of the first LED 310 is electrically connected to the first lead frame 211 through a first wire 411, and a second electrode 312 of the first LED 310 is electrically connected to the second lead frame 212 through a second wire 412.

A first electrode 341 of the fourth LED 340 is electrically connected to the second lead frame 212 through a third wire 413, and a second electrode 342 of the fourth LED 340 is electrically connected to the third lead frame 213 through a fourth wire 414.

The first LED 310 is formed on a first heat conductor 610. The first LED 310 is electrically separated from the first heat conductor 610.

The first heat conductor 610 includes a via hole 611 filled with a material with high heat conductivity. The first heat conductor 610 is connected to a metal layer 662 under a substrate 100 through the via hole 611.

Similarly, the fourth LED 340 is formed on a fourth heat conductor 640. The fourth LED 340 is electrically separated from the fourth heat conductor 640.

The fourth heat conductor 640 includes a via hole 641 filled with a material with high heat conductivity. The fourth heat conductor 640 is connected to a metal layer 662 under the substrate 100 through the via hole 641.

Also, the light emitting device includes a seventh lead frame 217, an eighth lead frame 218, and a ninth lead frame 219, which are formed on the substrate 100, and a second LED 320 and a fifth LED 350, which are electrically connected to at least one of the seventh lead frame 217, the eighth lead frame 218, and the ninth lead frame 219.

For example, the second LED 320 and the fifth LED 350 may be an LED that emits blue light, and are connected in series through the seventh lead frame 217, the eighth lead frame 218, and the ninth lead frame 219.

A first electrode 321 of the second LED 320 is electrically connected to the seventh lead frame 217 through a seventh wire 417, and a second electrode 322 of the second LED 320 is electrically connected to the eighth lead frame 218 through a eighth wire 418.

A first electrode 351 of the fifth LED 350 is electrically connected to the eighth lead frame 218 through a ninth wire 419, and a second electrode 352 of the fifth LED 350 is electrically connected to the ninth lead frame 219 through a tenth wire 420.

The second LED 320 is formed on a second heat conductor 620. The second LED 320 is electrically separated from the second heat conductor 620.

The second heat conductor 620 includes a via hole 621 filled with a material with high heat conductivity. The second heat conductor 620 is connected to the metal layer 662 under the substrate 100 through the via hole 621.

Similarly, the fifth LED 350 is formed on a fifth heat conductor 650. The fifth LED 350 is electrically separated from the fifth heat conductor 650.

The fifth heat conductor 650 includes a via hole 651 filled with a material with high heat conductivity. The fifth heat conductor 650 is connected to the metal layer 662 under the substrate 100 through the via hole 651.

Also, the light emitting device includes a fourth lead frame 214, a fifth lead frame 215, and a sixth lead frame 216, which are formed on the substrate 100, and a third LED 330 and a six LED 360, which are electrically connected to the fourth lead frame 214, the fifth lead frame 215, and the sixth lead frame 216.

For example, the third LED 330 and the sixth LED 360 may be an LED that emits red light, and are connected in series through the fourth lead frame 214, the fifth lead frame 215, and the sixth lead frame 216.

A first electrode (not shown) of the third LED 330 is in contact with and electrically connected to the fourth lead frame 214. A second electrode 332 of the third LED 330 is electrically connected to the fifth lead frame 215 through a fifth wire 415.

A first electrode (not shown) of the sixth LED 360 is in contact with and electrically connected to the fifth lead frame 215. A second electrode 362 of the sixth LED 360 is electrically connected to the sixth lead frame 216 through a sixth wire 416.

In the embodiment, the fifth lead frame 215 is electrically connected to the third LED 330, and the sixth LED 360 is mounted on the fifth lead frame 215 and is electrically connected thereto. Although not shown, the fifth lead frame 215 is divided into two portions. In this case, a first portion of the fifth lead frame 215 may be electrically connected to the third LED 330, and the sixth LED 360 may be mounted on a second portion of the fifth lead frame 215 and electrically connected thereto. The first and second portions of the fifth lead frame 215 may be electrically connected to each other through a wire.

The third LED 330 is formed on the fourth lead frame 214, and a third heat conductor 630 is formed adjacent to the fourth lead frame 214.

The third LED 330 is electrically separated from the third heat conductor 630.

The third heat conductor 630 includes a via hole 631 filled with a material with high heat conductivity. The third heat conductor 630 is connected to the metal layer 662 under the substrate 100 through the via hole 631.

A first heat transfer pad 710 is formed on the fourth lead frame 214 and the third head conductor 630 such that heat can be transferred effectively between the fourth lead frame 214 and the third heat conductor 630.

The first heat transfer pad 710 is formed of a material with very high electrical resistance, and thus the fourth lead frame 214 is electrically separated from the third heat conductor 630.

Similarly, the sixth LED 360 is formed on the fifth lead frame 215, and a sixth heat conductor 660 is formed adjacent to the fifth lead frame 215.

The sixth LED 360 is electrically separated from the sixth heat conductor 660.

The sixth heat conductor 660 includes a via hole 661 filled with a material with high heat conductivity, and is connected to the metal layer 662 under the substrate 100 through the via hole 661.

A second heat transfer pad 720 is formed on the fifth lead frame 215 and the sixth heat conductor 660 such that heat can be transferred effectively between the fifth lead frame 215 and the six heat conductor 660.

The second heat transfer pad 720 is formed of a material with very high electrical resistance, and thus the fifth lead frame 215 is electrically insulated from the sixth heat conductor 660.

The light emitting device according to the embodiments can selectively determines a dissipation method of heat generated in the LED depending on a mount type of the LED.

When the LED is spaced apart from lead frames for supplying a power voltage, the LED can be mounted on a heat conductor spaced apart from the lead frames. Since a insulating material is formed on a bottom surface of the LED, the LED is electrically separated from the heat conductor.

The heat conductor is connected to the metal layer under the substrate through the via hole filled with a material with high heat conductivity for maximize the heat dissipation efficiency.

Therefore, the LED can be electrically separated from the metal layer under the substrate, thereby preventing electrical short circuit caused by the metal layer under the substrate and maximizing the heat dissipation efficiency.

When the LED is mounted on one of the lead frames for supplying a power voltage, the heat conductor can be formed adjacent the lead frame on which the LED is mounted.

Since the lead frame is spaced apart from the heat conductor, the lead frame is electrically separated from the heat conductor.

However, since the heat transfer pad is formed on the lead frame and the heat conductor, heat can be quickly transferred from the lead frame to the heat conductor through the heat transfer pad.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

A light emitting device according to embodiments can be applied to electronic devices and lighting devices.

The invention claimed is:

1. A light emitting device comprising:
 a substrate including a plurality of via holes;
 a first lead frame disposed on a top surface of the substrate;
 a second lead frame disposed on the top surface of the substrate and spaced from the first lead frame;
 a metal layer disposed under a lower surface of the substrate;
 a light emitting diode disposed on a top surface of the first lead frame and electrically connected to the first lead frame and the second lead frame, the light emitting diode vertically overlapping the first lead frame;
 a heat conductive layer physically contacting the top surface of the substrate;
 a heat transfer pad physically contacting the top surface of the first lead frame and a top surface of the heat conductive layer; and
 a molding member directly contacting the light emitting diode and the first lead frame, the molding member not contacting the heat transfer pad,
 wherein the first lead frame comprises a protruding portion protruded toward the heat conductive layer and the heat conductive layer comprises a recessed portion, the protruding portion of the first lead frame protruding into the recessed portion of the heat conductive layer,
 wherein the plurality of via holes overlap the heat conductive layer and the metal layer,
 wherein the heat transfer pad is made of one of a resin, a tape and paint, and does not overlap the light emitting diode,
 wherein the heat conductive layer does not vertically overlap entire regions of the first lead frame, the second lead frame and the light emitting diode,
 wherein the heat conductive layer is not electrically connected to the first lead frame and the second lead frame,
 wherein the heat transfer pad vertically overlaps the protruding portion, a portion of the first lead frame, the recessed portion and a portion of the heat conductive layer,
 wherein the heat transfer pad does not vertically overlap the plurality of via holes,
 wherein the molding member does not vertically overlap an entire region of the heat conductive layer and an entire region of the heat transfer pad,
 wherein the heat transfer pad has a material different from the molding member,
 wherein the heat conductive layer includes a metal material, and
 wherein the heat transfer pad is formed of an electrically nonconductive material;
 wherein the heat transfer pad directly contacts the top surface of the first lead frame, the top surface of the heat conductive layer, and an exposed portion of the substrate between the first lead frame and the heat conductive layer.

2. The light emitting device according to claim 1, wherein the first lead frame and the light emitting diode are electrically connected to each other through a wire.

3. The light emitting device according to claim 1, wherein the second lead frame is electrically connected to the light emitting diode through a wire.

4. The light emitting device according to claim 1, wherein the recessed portion surrounds the protruding portion.

5. The light emitting device according to claim 1, wherein at least a part of a portion of the first lead frame that contacts the lower surface of the heat transfer pad is formed of a material with heat conductivity higher than that of a portion of the first lead frame that does not contact the lower surface of the heat transfer pad.

6. The light emitting device according to claim 1, wherein at least a part of a portion of the heat conductive layer that contacts the heat transfer pad is formed of a material with heat conductivity higher than that of a portion of the heat conductive layer does not contact the heat transfer pad.

7. The light emitting device according to claim 1, wherein the heat transfer pad thermally connects the second lead frame to the heat conductive layer, and
 wherein a width of the heat transfer pad is greater than a width of an interval between the first lead frame and the heat conductive layer.

* * * * *